United States Patent [19]
Mueller et al.

[11] 3,995,236
[45] Nov. 30, 1976

[54] DOUBLE SIDEBAND MODULATOR

[75] Inventors: Clifford E. Mueller, Wellington, Mo.; William E. Mears, Leawood, Kans.

[73] Assignee: Wilcox Electric, Inc., Kansas City, Mo.

[22] Filed: Sept. 30, 1974

[21] Appl. No.: 510,615

[52] U.S. Cl. ............................ 332/44; 325/138; 329/145; 329/205 R; 332/17; 332/42; 332/53; 343/124
[51] Int. Cl.$^2$ .................. H03C 1/14; H03C 1/58; H03D 1/24
[58] Field of Search .............. 332/17, 44, 52, 23 R, 332/31 R, 42, 53; 328/24; 325/138, 49, 329; 343/106 R, 106 D, 124; 329/145, 205 R

[56] References Cited
UNITED STATES PATENTS

| | | | |
|---|---|---|---|
| 3,260,955 | 7/1966 | Offner | 330/30 D |
| 3,328,798 | 6/1967 | Warfield et al. | 343/106 R |
| 3,551,850 | 12/1970 | Rudolph et al. | 332/44 |
| 3,553,590 | 1/1971 | Hofgen | 332/44 X |
| 3,675,162 | 7/1972 | Owen et al. | 332/44 X |

*Primary Examiner*—Siegfried H. Grimm
*Attorney, Agent, or Firm*—D. A. N. Chase

[57] ABSTRACT

A modulator employs a pair of variable RF attenuators to produce a double sideband, suppressed carrier output. The attenuator devices are PIN diodes which are rendered alternately conductive in synchronism with the recurring half cycles of the audio frequency input signal which is to be impressed upon the radio frequency signal as modulation. As each diode conducts the RF signal, its attenuation is varied by a control signal in a manner to provide the conducted RF signal with a modulation envelope that follows the amplitude of the audio input. The modulated signals from both diodes are combined at the modulator output, after a phase reversal of the modulated signal from one of the diodes, in order to thereby provide a double sideband, suppressed carrier output signal. The control signal for each conducting diode is produced by a function generator operating within a closed loop feedback system. The generator receives the audio input and a recreated modulating signal derived without carrier insertion from an envelope detector on the modulator output, and compares the recreated modulation with the original audio input to provide the control signal with the proper wave shape. An electronic goniometer for a VOR navigation system employs two of the double sideband modulators responsive to 30 Hz input signals that are 90° out of phase; thus a 90° modulation envelope phase difference exists at the goniometer outputs as required for the variable phase antenna feeds of a VOR transmitting system.

10 Claims, 5 Drawing Figures

DOUBLE SIDEBAND MODULATOR

This invention relates to improvements in double sideband, suppressed carrier modulators and, more particularly, to a modulator that is especially adapted for use in a VOR goniometer and which employs alternately conductive, variable RF attenuator devices to produce the variable phase, double sideband signals with complete carrier suppression.

In VOR (vhf omnirange) navigation systems employing a stationary transmitting antenna, a goniometer is required in order to produce two double sideband, suppressed carrier signals having a 90° modulation envelope phase difference. These two signals drive the VOR transmitting antenna in such a manner that a rotating figure-of-eight electrostatic field is radiated. Traditionally, a mechanical goniometer has been utilized as a means of producing these two double sideband signals and, although it has proven to be a successful device, the mechanical goniometer possesses disadvantages inherent in any mechanical apparatus where moving parts subject to friction and wear are involved. Accordingly, in recent years electronic goniometers have been developed to replace the mechanical device, such as shown and described in U.S. Pat. No. 3,328,798 owned by the assignee herein. This electronic goniometer employs a double bridge network containing varactor diodes in the bridge arms and is completely devoid of moving parts.

However, the varactor diode bridge goniometer is relatively complex although completely nonmechanical. Simplicity is an objective in goniometer design due to the inherent requirement of reliability and the necessity for operation on a continuous basis as one of the important subsystems of a VOR transmitter. Furthermore, if the number of components of the goniometer can be significantly reduced, then initial installation costs are likewise reduced as well as the incidence of repair and maintenance.

Besides the double bridge arrangement for an electronic goniometer disclosed in the above-referenced patent, double sideband, suppressed carrier modulation systems in general are known in the art and accomplish the modulation process through successive phase reversals of the RF wave and modulation of this wave with a full wave rectified version of the audio modulating signal. This approach also suffers from disadvantages in that it necessitates the use of a modulated amplifier stage after the RF phase shift circuitry and further requires that modulation of the phase-changing RF signal be effected from a zero reference with a rectified signal of a single polarity. It is difficult to modulate in this manner without a problem of audio nonlinearity, in addition to the inherent possibility of an undesired RF phase shift in the modulated amplifier stage.

It is, therefore, an important object of the present invention to provide a double sideband, suppressed carrier modulator that employs a minimum number of components and eliminates the use of modulated amplifier stages.

As a corollary to the foregoing object, it is an important aim of this invention to provide a modulator as aforesaid which is relatively free of RF phase shift problems and which contains uncomplex audio circuitry, and which accomplishes the modulation process necessary to produce a double sideband, suppressed carrier signal without employing a rectified version of the audio modulation information.

Furthermore, it is an important aim of the present invention to provide an improved electronic goniometer for VOR systems which is completely nonmechanical, minimizes the number of electrical components, and generates a pair of double sideband, suppressed carrier signals having the requisite modulation envelope phase difference through the use of a pair of modulators as set forth in the preceding objects.

Another important object of this invention is to provide a modulator as aforesaid which employs a pair of variable RF attenuator devices that alternately conduct the radio frequency signal and are controlled as to the attenuation presented so that, after a 180° phase shift of one of the conducted RF signals, the modulated signals from the two devices may be combined to form the desired double sideband, suppressed carrier output.

Additionally, it is an important object of this invention to provide a method of modulating a radio frequency signal with a relatively low frequency signal to produce a double sideband, suppressed carrier output, wherein the modulation process is accomplished by rendering a pair of variable RF attenuator devices alternately conductive in synchronism with the recurring half cycles of the low frequency signal.

Still another important object of the invention is to provide a modulator as aforesaid utilizing alternately conducting, variable RF attenuator devices which are each operated by a control signal that causes the modulation envelope of the conducted RF signal to follow the amplitude of the low frequency modulation information, wherein such control signal has a variable wave shape which automatically compensates for nonlinearities in the modulator system which would otherwise cause distortion of the modulation envelope.

Yet another important objective is to provide a means of recreating the modulation information in the envelope of a double sideband, suppressed carrier signal without inserting the carrier wave in the demodulation process, and to provide a closed loop feedback system for controlling the aforesaid modulator wherein the recreated modulation is compared with the input modulating signal.

THE NAVIGATION SYSTEM IN GENERAL

Figure 1:
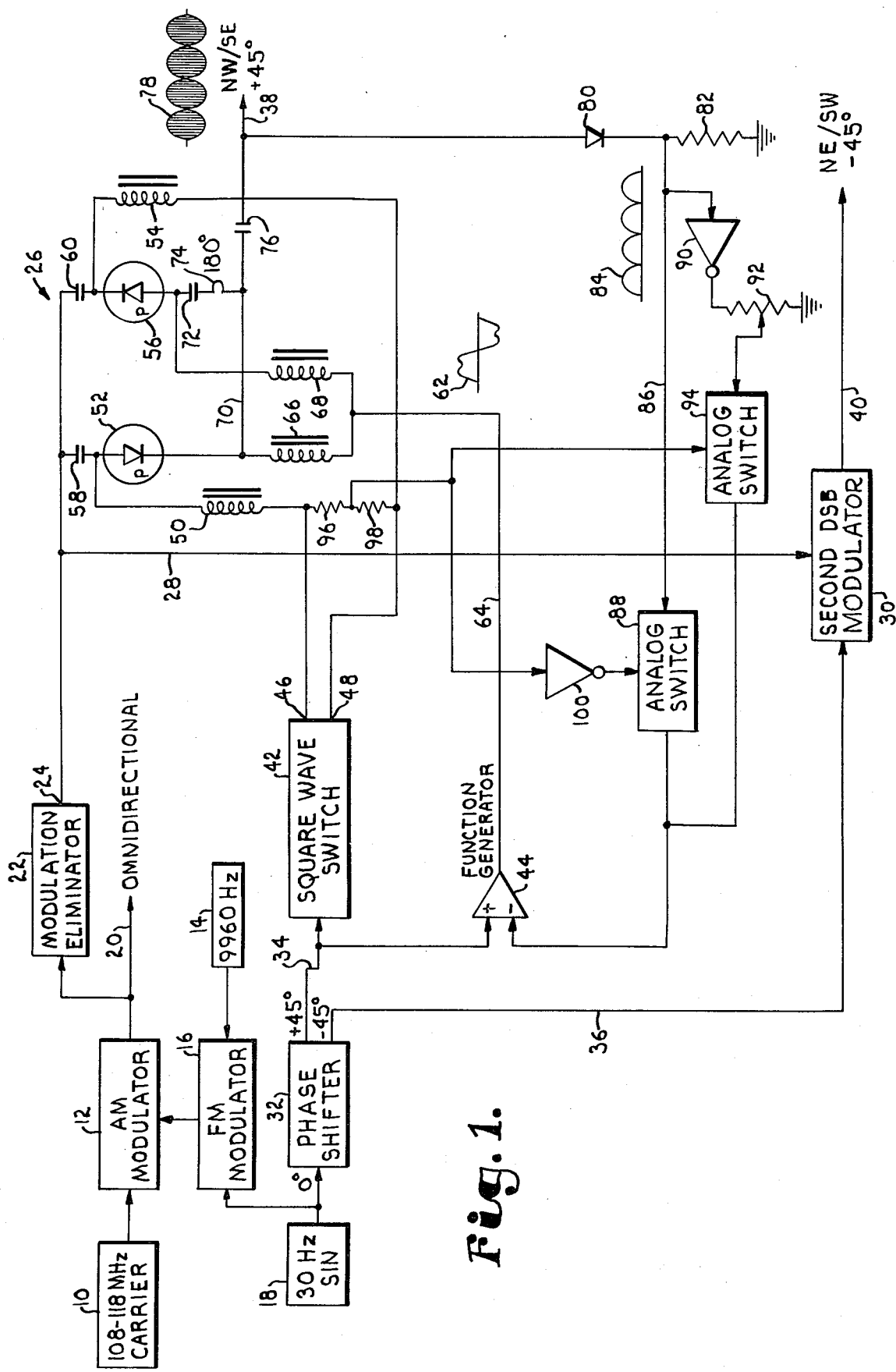
FIG. 1 is a block and schematic diagram of a VOR transmitter incorporating the goniometer of the present invention.

FIG. 1 illustrates a VOR transmitter utilizing, for example, a carrier frequency in the range of from 108 to 118 MHz. The carrier wave generator is shown at 10, the output thereof being fed to one input of an AM modulator 12. A modulating signal having a frequency of 9960 Hz is produced by a signal source 14 and fed to one input of an FM modulator 16. The 9960 Hz signal may be considered a subcarrier since the same is frequency modulated by a 30 Hz sinusoidal modulating signal generated by a signal source 18. As FIG. 1 clearly illustrates, the subcarrier and the 30 Hz modulating signal are combined in the FM modulator 16 and then fed to the AM modulator 12 to serve as a modulating signal for the radio frequency carrier wave.

The output from the AM modulator 12 is illustrated at 20, it being apparent that the signal at such output comprises the RF carrier amplitude modulated by the subcarrier delivered from the FM modulator output, such subcarrier having a center frequency of 9960 Hz and being frequency modulated by the 30 Hz signal from source 18. This composite signal is fed to the omnidirectional feed of a VOR transmitting antenna to form one component of the propagated navigational signal.

The composite signal appearing at output 20 is also fed to a modulation eliminator 22 which delivers the RF carrier free of modulation at its output 24. The pure carrier is delivered to a first double sideband modulator broadly denoted 26 and, via a lead 28, to a second double sideband modulator illustrated at 30 in block diagram from. The circuitry of the two modulators 26 and 30 is identical; thus only the modulator 26 is illustrated in detail.

The 30 Hz signal from source 18 is also fed to a phase shift network 32 which effectively splits the signal into two audio input signals for the respective modulators 26 and 30. One such signal, displaced 45° in phase in the positive direction, appears at the audio input lead 34 of the modulator 26, whereas the other signal (displaced 45° in phase in the negative direction) appears at the audio input lead 36 of the modulator 30. Accordingly, the 30 Hz sinusoidal signals at modulator inputs 34 and 36 have a 90° phase difference, resulting in a 90° modulation envelope phase difference at the respective modulator outputs 38 and 40.

Figure 3:
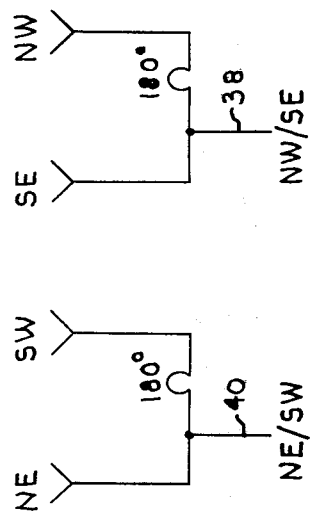
FIG. 3 is a schematic illustration of a VOR slot antenna showing the variable phase feeds.

The two double sideband, suppressed carrier modulators 26 and 30 comprise an electronic goniometer which is employed in the VOR transmitter for the purpose of generating a rotating figure-of-eight signal pattern. This is accomplished in conjunction with a VOR transmitting antenna such as the slot antenna illustrated schematically in FIG. 3. An exemplary antenna of this type is shown in U.S. Pat. No. 2,746,039 and, as a convenient analogy, may be considered to be a pair of crossed dipoles (turnstile antenna). Antennas of this general type have an omnidirectional feed to which the output 20 from the AM modulator 12 is connected (not shown in FIG. 3), and a pair of variable phase feeds to which the goniometer outputs 38 and 40 are connected. These outputs 38 and 40 are also denoted by the legends NW/SE and NE/SW respectively in FIGS. 1 and 3. This refers to the azimuth designations of the slot pairs of the antenna, the output 38 being fed to the northwest (NW) and southeast (SE) slots whereas the double sideband signal at output 40 is fed to the northeast (NE) and southwest (SW) slots. The feeders terminate across each pair of slots such as to excite opposed slots in phase opposition, as indicated in FIG. 3 by the 180° phase delay between slots NE and SW and between slots SE and NW. The cumulative effect, as is well known in the radio navigation art, is to provide a rotating variable signal component in addition to the omnidirectional or reference signal component, the variable pattern rotating at a speed of 30 revolutions per second to produce 30 Hz space modulation of the reference carrier. At the airborne receiver, the phase angle between the 30 Hz variable signal resulting from space modulation and the 30 Hz reference signal on the omnidirectional carrier is determined in order to provide the pilot with the azimuth information.

THE GONIOMETER

Figure 5:
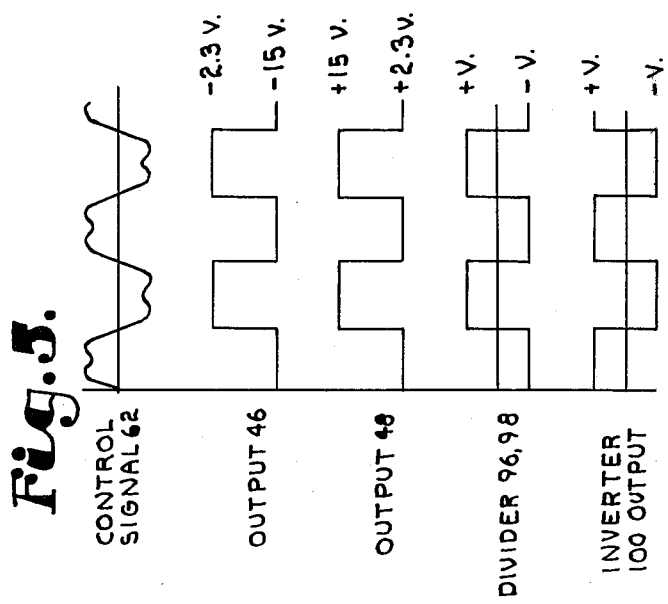
FIG. 5 is a graph illustrating five wave forms in time relationship appearing at various points in the circuitry of FIG. 1.

Referring to the modulator 26 illustrated in detail in FIG. 1 which provides the NW/SE goniometer output 38, the audio input lead 34 is connected to a square wave switch 42 and the positive (+) input of a function generator 44. The square wave switch 42 is a transistor switching circuit which receives the 30 Hz sinusoidal input signal and provides two square waves at its outputs 46 and 48 with a shift in DC reference as indicated in FIG. 5. The square wave at output 46 oscillates between −15 volts and −2.3 volts, while the square wave at output 48 oscillates between +2.3 and +15 volt levels. An RF choke 50 connects output 46 to the anode of a PIN diode 52, and an RF choke 54 connects the output 48 with the cathode of a PIN diode 56. The RF carrier from the output 24 of the modulation eliminator 22 is delivered to the anode of diode 52 and the cathode of diode 56 through a pair of DC blocking capacitors 58 and 60 respectively.

The PIN diodes 52 and 56 are employed as variable RF attenuators in the present invention. Each diode is essentially a resistive element which, when forward biased, exhibits a resistance that is controlled by the bias current. The diodes may, for example, be selected from the UM4000 series manufactured by Unitrode Corporation of Watertown, Mass. When back biased, the diode 52 and 56 will not conduct the RF carrier delivered by the modulation eliminator, but in a forward biased condition conduction of the carrier is controlled in a manner to provide a modulating element as will be described hereinbelow.

The function generator 44 has an output which delivers a control signal whose wave shape is illustrated at 62 in FIG. 1 and which is shown in FIG. 5 in its time relationship with the square wave outputs of the switch 42. The control signal 62 appears along a lead 64 that, in separate branches, extends to the cathode of diode 52 and the anode of diode 56. RF chokes 66 and 68 are interposed in the respective branches. The cathode of diode 52 and the anode of diode 56 are connected to a common lead 70, the former by a direct connection and the latter via a DC blocking capacitor 72 and a 180° phase delay line 74. The common lead 70 is isolated from the modulator output 38 by a DC blocking capacitor 76. The wave form 78 illustrates the double sideband, suppressed carrier signal appearing at the output 38.

An envelope detector is formed by a diode 80 and a series resistor 82, the anode of the diode 80 being connected to the modulator output 38. The detected modulation envelope, illustrated by wave form 84, appears across resistor 82 and is fed via a lead 86 to the switching input of an analog switch 88. The detected envelope is also fed to an inverter 90 whose output is connected to a potentiometer 92, the variable tap thereof being in turn connected to the switching input of an analog switch 94. The outputs of both of the analog switches 88 and 94 are connected in common to the negative or inverting (−) input of the function generator 44. It may be appreciated, therefore, that the function generator 44 operates within a closed loop feedback system extending from the modulator output 38 through the analog switches 88 and 94 to the inverting input of function generator 44, and then back to the modulator output via the function generator output lead 64 and the common lead 70.

A pair of series resistors 96 and 98 are connected across the square wave switch outputs 46 and 48 and provide a voltage divider from which square wave gating signals are obtained to control the operation of the analog switches 88 and 94. The resistors 96 and 98 are of equal ohmic value; thus the voltage wave form appearing at their common junction point has a zero crossing with positive and negative excursions as illustrated in FIG. 5. This gating signal is applied directly to the control input of analog switch 94 and, via an inverter 100, to the control input of the analog switch 88. The output of inverter 100 is also shown in FIG. 5.

OPERATION

Figure 2:
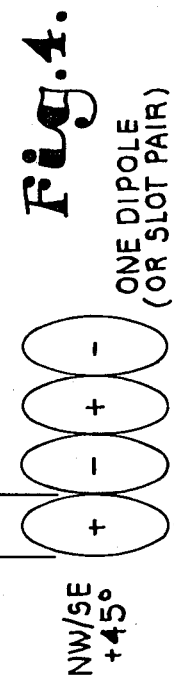
FIG. 2 is a graph showing the wave form of an exemplary double sideband, suppressed carrier signal.

The double sideband, suppressed carrier modulation process is accomplished by rendering the PIN diodes 52 and 56 alternately conductive in synchronism with the recurring half cycles of the low frequency (30 Hz) signal appearing at input 34. The RF signal conducted by the diode 56 is reversed in phase by the 180° delay line 74 so that, when combined with the RF signal conducted by diode 52, a true double sideband, suppressed carrier signal is formed at the output 38. The output wave form 78 is shown in greater detail in FIG. 2 where it may be clearly seen that the RF signal within the modulation envelope undergoes a phase reversal with each recurring pulse, although the illustration in FIG. 2 is idealized for clarity and is not intended to show the true relationship in frequency between the RF and modulating signals.

The square wave switch 42 is utilized to thoroughly back bias the nonconducting PIN diode to prevent leakage of the RF signal therethrough while the other diode is in its conductive state. Note that the capacitors 58, 60 and 72 block audio frequencies but have no effect on the RF carrier from the modulation eliminator 22. As may be seen in FIG. 5, the square wave at output 46 is highly negative (−15 volts) during every other half cycle of the 30 Hz input signal, whereas the square wave at output 48 is highly positive (+15 volts) during intervening half cycles. Output 46 is connected to the anode of diode 52, and output 48 is connected to the cathode of diode 56; thus the diodes are alternately heavily back biased. This bias is reduced to 2.3 volts on each diode when it is conditioned for conduction, but is not completely removed in order to prevent the RF signal from itself placing the diode in conduction due to its own generation of a rectified direct current.

The 2.3 and 15 volt fixed bias levels are merely illustrative and, in practice, would be selected to accommodate the operating characteristic of the particular PIN diode selected. Control of the diode that is to conduct is governed by the function generator 44 which produces the nonsinusiodal control signal 62. The positive half cycle of signal 62 varies the attenuation presented by diode 56 as it conducts the RF signal, and the negative half cycle of control signal 62 varies the attenuation presented by diode 52 when it is in conduction. The half cycle of the control signal 62 applied to the diode which is to conduct overcomes the 2.3 volt fixed bias to produce the required attenuation variation. The RF chokes 50, 54, 66 and 68 isolate both the square wave switch 42 and the function generator 44 from the RF energy handled by the PIN diodes.

The objective is to vary the attenuation of each conducting diode in a manner to provide the conducted radio frequency signal with a modulation envelope that follows the amplitude of the 30 Hz signal at input 34. Nonlinearities present in the system, including the nonlinear characteristic of the diodes 52 and 54, require that the wave shape of control signal 62 be nonsinusoidal in order to produce an undistorted, sinusoidal modulation envelope on the output wave form 78. The shaping of the control signal 62 is accomplished by the function generator 44 operating within the closed feedback loop.

More particularly, the function generator 44 is a very high gain, integrated circuit operational amplifier which produces a difference signal at its output that is the resultant of a comparison of the signals appearing at its positive and negative inputs. The sinusoidal audio appearing at input 34 is directly fed to the positive input of generator 44, whereas its negative (inverting) input receives a recreated modulating signal derived from the envelope of the double sideband, suppressed carrier signal appearing at output 38. This output signal, as represented by the wave form 78, is detected by the action of the envelope detector diode 80, resulting in a positive, rectified envelope that appears along lead 86 as represented by the wave form 84. This is fed to the analog switch 88 and to the inverter 90 where the negative half of the modulation envelope is derived by inversion. Accordingly, the analog switch 94 receives a signal from potentiometer 92 exactly like the rectified signal represented by wave form 84 except of opposite polarity.

Each of the switches 88 and 94 may, for example, comprise a CMOS analog gate capable of conducting either a positive or a negative signal when a positive gating voltage is applied to its control input, the gate being nonconductive when a negative voltage is applied. Referring to FIG. 5, the square wave voltage from divider 96, 98 is negative when the control signal 62 is positive, and is positive when the control signal 62 is negative; the converse is true with respect to the output of inverter 100. Accordingly, the analog switches 88 and 94 are alternately closed in synchronism with the square wave at voltage divider 96, 98 which, in turn, is in synchronism with the recurring half cycles of the 30 Hz audio input. If the envelope of the double sideband, suppressed carrier output from the modulator is sinusoidal, the result is that a 30 Hz sinusoidal modulating signal will be recreated at the common output of the two analog switches 88 and 94 and delivered to the negative input of the function generator 44. Such recreated modulation will be in phase with the desired 30 Hz modulation appearing at input 34.

The recreated modulation from analog switches 88 and 94 is fed to the inverting input of function generator 44 as a negative feedback signal which generator 44 compares with the 30 Hz input to produce a difference signal (control signal 62) that modulates the PIN diodes 52 and 56. Accordingly, the feedback system compensates for nonlinearities and drives the PIN diodes in a manner to impart the 30 Hz modulation to the RF signal without distortion. The feedback signal is derived from the modulator output without the need for carrier insertion in the detection process; thus the demodulation of the double sideband, suppressed carrier signal is accomplished without handling radio frequency energy.

It should be noted that, since the PIN diodes 52 and 54 are individually responsible for alternate lobes or pulses of the modulator output, differences in the attenuation characteristic of the diodes could cause successive lobes of unequal amplitude. Accordingly, potentiometer 92 is provided so that the amplitude of the lobe formed by diode 52 may be adjusted for alignment purposes.

Figure 4:
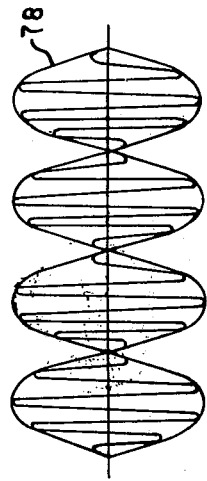
FIG. 4 is an illustration of the modulation envelopes obtained at the two goniometer outputs, showing the phase difference therebetween.

The modulator 30 operates in the same manner as modulator 26 discussed above, the only difference being that the 30 Hz signal appearing on input lead 36 has a phase lag of 90° relative to the 30 Hz signal at the input 34 of modulator 26. The result of this phase difference is illustrated in FIG. 4, where it may be seen that the modulation envelope phase difference between the outputs 38 and 40 is 90° as required for a VOR goniometer. The phase reversals of the RF energy in successive lobes are indicated by the "+" and "−" notation. The NE/SW signal at output 40 is fed to the corresponding opposed slots of the VOR antenna, and likewise for the NW/SE signal at output 38, as illustrated in FIG. 3 and discussed hereinabove.

Having thus described the invention, what is claimed as new and desired to be secured by Letters Patent is:

1. A modulator for producing a double sideband, suppressed carrier output, said modulator comprising:
   a pair of variable attenuator devices;
   means for delivering a radio frequency signal to said devices for conduction therethrough;
   a source of relatively low frequency signal to be impressed upon said radio frequency signal as modulation;
   control means responsive to said low frequency signal and operably coupled with said devices for rendering each device conductive during a corresponding half cycle of said low frequency signal to effect conduction of said radio frequency signal through said devices alternately, and for varying the attenuation of the conducting device in a manner to provide the conducted radio frequency signal with a modulation envelope that follows the amplitude of said low frequency signal;
   means for reversing the phase of the radio frequency signal conducted by one of said devices relative to the phase of the radio frequency signal conducted by the other of said devices; and
   output terminal means for receiving the modulated signal from said other device and the phase reversed, modulated signal from said one device and combining the same to provide said double sideband, suppressed carrier output.

2. The modulator as claimed in claim 1, wherein said variable attenuator devices are electrically controllable, and wherein said control means applies a control signal to the conducting device that causes said variation in its attenuation.

3. The modulator as claimed in claim 1, wherein each of said devices is capable of being forward biased into varying degrees of conductivity and back biased to nonconduction, and wherein said control means alternately back biases each device and applies a control signal thereto to forward bias the same to cause said variation in its attenuation.

4. The modulator as claimed in claim 3, wherein each of said devices is a PIN diode.

5. The modulator as claimed in claim 1, wherein said variable attenuator devices are electrically controllable, and wherein said control means includes an envelope detector coupled with said output terminal means and responsive to said double sideband, suppressed carrier output, circuitry responsive to the detected modulation envelope for recreating the modulation that would be present if the carrier were not suppressed, and a function generator having first and second inputs receiving said low frequency signal and said recreated modulation respectively and having an output that delivers a control signal to the conducting device, said function generator being operable to compare said recreated modulation with said low frequency signal and provide said control signal with a time-varying amplitude that causes said variation in attenuation.

6. The modulator as claimed in claim 5, wherein said circuitry includes means for providing the inverse of said detected modulation envelope, a pair of analog switches receiving the detected and inverted envelopes respectively and connected with said second input of the function generator, and operating means responsive to said low frequency signal for closing each analog switch in synchronism with a corresponding half cycle of said low frequency signal to effect delivery of the detected and inverted envelopes to said second input alternately from said switches.

7. An electronic goniometer for producing a pair of double sideband, suppressed carrier output signals having a predetermined modulation envelope phase difference, said goniometer comprising a pair of modulators as claimed in claim 1 wherein said radio frequency signal is common to both modulators, said sources including means for receiving low frequency modulation information and deriving therefrom the low frequency signals for the respective modulators separated by said predetermined phase difference.

8. A method of modulating a radio frequency signal with a relatively low frequency signal to produce a double sideband, suppressed carrier output, said method comprising the steps of:
   delivering said radio frequency signal to a pair of variable attenuator devices;
   rendering each of said devices conductive during a corresponding half cycle of said low frequency signal to effect conduction of said radio frequency signal through said devices alternately;
   varying the attenuation of the conducting device in a manner to provide the conducted radio frequency signal with a modulation envelope that follows the amplitude of said low frequency signal;
   reversing the phase of the radio frequency signal conducted by one of said devices relative to the phase of the radio frequency signal conducted by the other of said devices; and
   combining the modulated signal from said other device and the phase reversed, modulated signal from said one device to provide said double sideband, suppressed carrier output.

9. The method as claimed in claim 8, wherein said varying of the attenuation of the conducting device is effected by applying a control signal thereto having a wave shape that causes said attenuation variation and which compensates for non-linearities in the modulation process.

10. Apparatus for demodulating a double sideband, suppressed carrier signal without carrier insertion, said apparatus comprising:
   an envelope detector responsive to the recurring pulses of said signal for providing a rectified output;

means for providing the inverse of said rectified output;
a pair of analog switches for receiving said rectified output and said inverse thereof respectively;
operating means connected with said switches for alternately closing the same in synchronism with said recurring pulses; and output means for combining the rectified signals alternately conducted by said switches, whereby the signals thus combined recreate the modulation information carried by said double sideband, suppressed carrier signal.

* * * * *